United States Patent
Wang

(10) Patent No.: US 8,344,822 B2
(45) Date of Patent: Jan. 1, 2013

(54) MATCHED INTEGRATED ELECTRONIC COMPONENTS

(75) Inventor: Zhenhua Wang, Emrach (CH)

(73) Assignee: ST-Ericsson SA, Plan-les-Ouates (CH)

( * ) Notice: Subject to any disclaimer, the term of this patent is extended or adjusted under 35 U.S.C. 154(b) by 330 days.

(21) Appl. No.: 12/771,718

(22) Filed: Apr. 30, 2010

(65) Prior Publication Data

US 2010/0271126 A1 Oct. 28, 2010

Related U.S. Application Data

(63) Continuation-in-part of application No. PCT/EP2008/009354, filed on Oct. 31, 2008.

(30) Foreign Application Priority Data

Nov. 2, 2007 (EP) ..................................... 07119900

(51) Int. Cl.
*H03H 7/38* (2006.01)
(52) U.S. Cl. .......................................... 333/32; 333/101
(58) Field of Classification Search ..................... 333/32, 333/33, 17.3, 262, 101
See application file for complete search history.

(56) References Cited

U.S. PATENT DOCUMENTS

| 4,280,089 | A | 7/1981 | van de Plassche et al. |
| 6,060,760 | A | 5/2000 | Tan |
| 2003/0117307 | A1 | 6/2003 | Deak |

FOREIGN PATENT DOCUMENTS

| JP | 59029447 A | 2/1984 |
| WO | 2007102133 A1 | 9/2007 |

OTHER PUBLICATIONS

Shyu et al., "Randon Error Effects in Matched MOS Capacitors and Current Sources," IEEE Journal of Solid-State Circuits, Dec. 1984, pp. 948-955, vol. SC-19, No. 6.
Lakshmikumar et al., "Characterization and Modeling of Mismatch in MOS Transistors for Precision Analog Design," IEEE Journal of Solid-State Circuits, Dec. 1986, pp. 1057-1066, vol. SC-21, No. 6.
Pelgrom et al., "Matching Properties of MOS Transistors", IEEE Journal of Solid-State Circuits, Oct. 1989, pp. 1433-1440, vol. 24, No. 5.
Y. Lin et al., "Resistor layout techniques for enhancing yield in ratio-critical monolithic application", Proc. NWSCAS 2001, vol. 1, pp. 259-261, 2001.

*Primary Examiner* — Stephen Jones
(74) *Attorney, Agent, or Firm* — Potomac Patent Group PLLC

(57) ABSTRACT

A switchable integrated electronic device includes at least three elements $r_1 \ldots r_{14}, s_1 \ldots s_{14}$ series coupled in a chain between a first port and a second port and includes a node between successive elements $r_1 \ldots r_{14}, s_1 \ldots s_{14}$ of the chain. There is a switch means for coupling a selectable one of the nodes to a third port. If successive elements $r_1 \ldots r_{14}, s_1 \ldots s_{14}$ in the chain are denoted $r_i$, i=1 to N, and if adjacent positions occupied by the elements are numbered consecutively 1 to N, then element $r_i$ occupies position $$\left\lfloor \frac{N+1}{2} \right\rfloor + (-1)^i \cdot 2 \cdot \left\lfloor \frac{i}{2} \right\rfloor \text{ for } i = 1 \text{ to } \left\lfloor \frac{N}{2} \right\rfloor$$

and position $$\left\lfloor \frac{N+1}{2} \right\rfloor + (-1)^i \cdot \left(2 \cdot \left\lfloor \frac{N-i}{2} \right\rfloor + 1\right) \text{ for } i = \left\lfloor \frac{N}{2} \right\rfloor + 1 \text{ to } N.$$

20 Claims, 4 Drawing Sheets

MATCHED INTEGRATED ELECTRONIC COMPONENTS

BACKGROUND

1. Technical Field

The disclosure relates to a switchable integrated electronic device, to electronic circuits incorporating the switchable integrated electronic device, and to a method of manufacturing a switchable integrated electronic device, and in particular the layout of such devices and circuits.

2. Description of the Related Art

The growth of the semiconductor industry is driven by the rapid development and evolution of applications such as wireless communications, imaging processing, internet, and entertainment. In order to reach a high-level of circuit integration and reduce the cost and size, and to enhance competitiveness, analog and mixed-signal circuits are implemented in standard CMOS. Recently, RF and power management functions are increasingly integrated on a digital chip. Device matching is very critical for these circuits, and it is well recognized that the yield and cost can be strongly affected by the design technique adopted, particularly the layout of matching-critical devices. These devices can be transistors, capacitors, inductors or resistors. Matching has become critically important since the process technology is driven by digital circuits where matching is not important.

The matching properties of transistors have been considered by K. Lakshmikumar et al in 'Characterization and modeling of mismatch in MOS transistors for precision analog design', IEEE J. Solid-State Circuits, vol. 21, pp. 1057-1066, December 1986 and by M. Pelgrom et al in 'Matching properties of MOS transistors', IEEE J. Solid-State Circuits, vol. 24, pp. 1433-1440, October 1989, and of transistors and capacitors by J. Shyu et al in 'Random error effects in matched MOS capacitors and current sources', IEEE J. Solid-State Circuits, vol. 19, pp. 948-956, December 1984. The matching properties of resistors have been considered by Y. Lin et al in 'Resistor layout techniques for enhancing yield in ratio-critical monolithic application', Proc. NWSCAS 2001, vol. 1, pp. 259-261, 2001. Proposed layout techniques, such as common-centroid, deal with matching of two closely placed MOS transistors of equal size only. In practical circuit design, what is frequently required are two devices having large and varying non-unity ratios, which must be precisely matched, which may be referred to as ratio matching. Unfortunately, the layout techniques developed for equal size devices cannot be directly applied to ratio matching.

Resistor layout differs somewhat from that of transistor layout. Straight-line resistors are usually avoided and each resistor is implemented by a series/parallel combination of a number of unit resistors. The most popular layout technique is interleaving. FIG. 1 shows an example of an amplifier where resistors R1 (non-shaded) and R2 (shaded) are implemented each using 9 resistor elements, with R1=R2. The node between R1 and R2 is denoted X. This configuration provides a fixed gain. In many systems a programmable gain amplifier is required and very often the gain must vary over a large range in a certain step size. If the gain is non-unity but fixed, it may still be possible to interleave the resistor elements of R1 and R2 to achieve good matching between R1 and R2. However, device matching becomes more problematic when the resistance ratio is not only large but also varying. For example, automatic gain control for cellular phones generally requires a gain range from −40 dB to +8 dB, in 4 dB steps. In this case, the resistance ratio R2/R1 has to vary from 0.01 to 2.51. As the gain varies, either R1 or R2, or both, must vary. As a result the constellation of R1 and R2, by which we mean the interleaving arrangement of R1 and R2, also varies. If the layout for R1 and R2 is optimized at one gain setting, switching to another gain causes the layout of R1 and R2 to be no longer optimum. This problem is exacerbated if the gain variation and the number of gain steps is large. There exists a need to improve the matching of components with large and varying component ratios.

BRIEF SUMMARY

According to a first aspect of the disclosure there is provided a switchable integrated electronic device, that includes:

at least three elements series coupled in a chain between a first port and a second port with nodes between successive elements of the chain; and switch means for coupling a selectable one of the nodes to a third port;

wherein, if successive elements in the chain are denoted $r_i$, i=1 to N, and if adjacent positions occupied by the elements are numbered consecutively 1 to N, then element $r_i$ occupies position $$\left\lfloor \frac{N+1}{2} \right\rfloor + (-1)^i \cdot 2 \cdot \left\lfloor \frac{i}{2} \right\rfloor \text{ for } i = 1 \text{ to } \left\lfloor \frac{N}{2} \right\rfloor$$

and position $$\left\lfloor \frac{N+1}{2} \right\rfloor + (-1)^i \cdot \left( 2 \cdot \left\lfloor \frac{N-i}{2} \right\rfloor + 1 \right) \text{ for } i = \left\lfloor \frac{N}{2} \right\rfloor + 1 \text{ to } N.$$

According to a second aspect of the disclosure there is provided a method of manufacturing a switchable integrated electronic device, comprising:

forming at least three elements series coupled in a chain between a first port and a second port and providing nodes between successive elements of the chain; and forming a switch means for coupling a selectable one of the nodes to a third port;

wherein, if successive elements in the chain are denoted $r_i$, i=1 to N, and if adjacent positions occupied by the elements are numbered consecutively 1 to N, then element $r_i$ occupies position $$\left\lfloor \frac{N+1}{2} \right\rfloor + (-1)^i \cdot 2 \cdot \left\lfloor \frac{i}{2} \right\rfloor \text{ for } i = 1 \text{ to } \left\lfloor \frac{N}{2} \right\rfloor$$

and position $$\left\lfloor \frac{N+1}{2} \right\rfloor + (-1)^i \cdot \left( 2 \cdot \left\lfloor \frac{N-i}{2} \right\rfloor + 1 \right) \text{ for } i = \left\lfloor \frac{N}{2} \right\rfloor + 1 \text{ to } N.$$

Note that in these expressions the symbol $\lfloor x \rfloor$ indicates the largest integer not exceeding the value x, and it is commonly referred to as the floor function. So, for example, $$\left\lfloor \frac{4}{2} \right\rfloor = 2$$

and $$\left\lfloor \frac{5}{2} \right\rfloor = 2.$$

Thus, the disclosure provides a layout for successive series-coupled elements of a switchable electronic device that enables components comprising the elements to be well matched irrespective of the switch setting, by ensuring a good interleaving of the elements of the components. For example, if the elements are resistors that determine the gain of an amplifier, the resistance between the first port and the third port, and between the second port and the third port, can be well matched regardless of gain setting of the amplifier, and hence the ratio of these resistances has a low spread. The disclosure is applicable to components with either large or small ratios.

Optionally the elements all comprise one of a resistive element, a capacitative element, an inductive element, and a semiconductor element. Usually, all of the elements are of the same type, e.g., resistive element, capacitive element, inductive element, semiconductor element etc. Thus the disclosure is applicable to a chain of series coupled resistors, a chain of series coupled capacitors, a chain of series coupled inductors, and a chain of series coupled semiconductor devices etc.

The disclosure also provides an electronic circuit, having a first switchable integrated electronic device according to the first aspect of the disclosure having its first port coupled to a first circuit input and its second port coupled to a circuit output, wherein the elements each comprise a resistive element, and an amplifier having a first amplifier input coupled to the third port of the first switchable integrated electronic device and an amplifier output coupled to the circuit output. In this way, the disclosure provides a switchable-gain amplifier having its gain determined by switchable resistors which are well matched regardless of the selected gain. Hence the gain has a low spread in value.

The disclosure also provides an electronic circuit as stated above and further comprising a second switchable integrated electronic device according to the first aspect of the disclosure having its first port coupled to a second circuit input, its second port coupled to ground or another point in the circuit, and its third port coupled to a second input of the amplifier, wherein the first and second amplifier inputs are respectively inverting and non-inverting, and wherein the elements of the second switchable integrated electronic device each comprise a resistive element. In this way, the disclosure provides a switchable-gain amplifier having inverting and non-inverting inputs and which has its gain determined by switchable resistors which are well matched regardless of the gain setting selected. Optionally, the first and second switchable integrated electronic devices may comprise an equal number of elements and the respective switch means of the first and second switchable integrated electronic devices may be adapted to couple a corresponding selectable one of the nodes of the first and second switchable integrated electronic devices to the respective third ports. This feature enables the inverting and non-inverting inputs to remain well balanced regardless of which gain setting is selected.

BRIEF DESCRIPTION OF THE SEVERAL VIEWS OF THE DRAWINGS

The disclosure will now be described, by way of example only, with reference to the accompanying drawings wherein.

DETAILED DESCRIPTION

Figure 1:
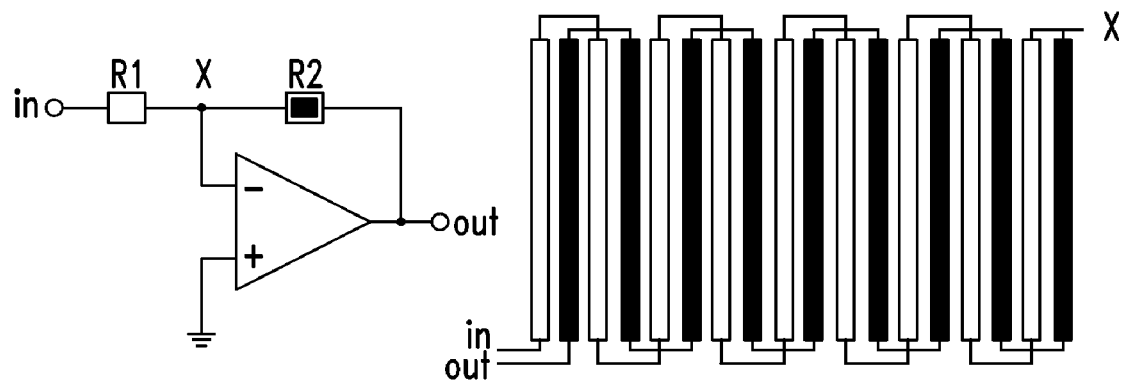
FIG. 1 shows a circuit diagram of an amplifier having two resistors and also shows a diagram of the layout of the two resistors.
Figure 2:
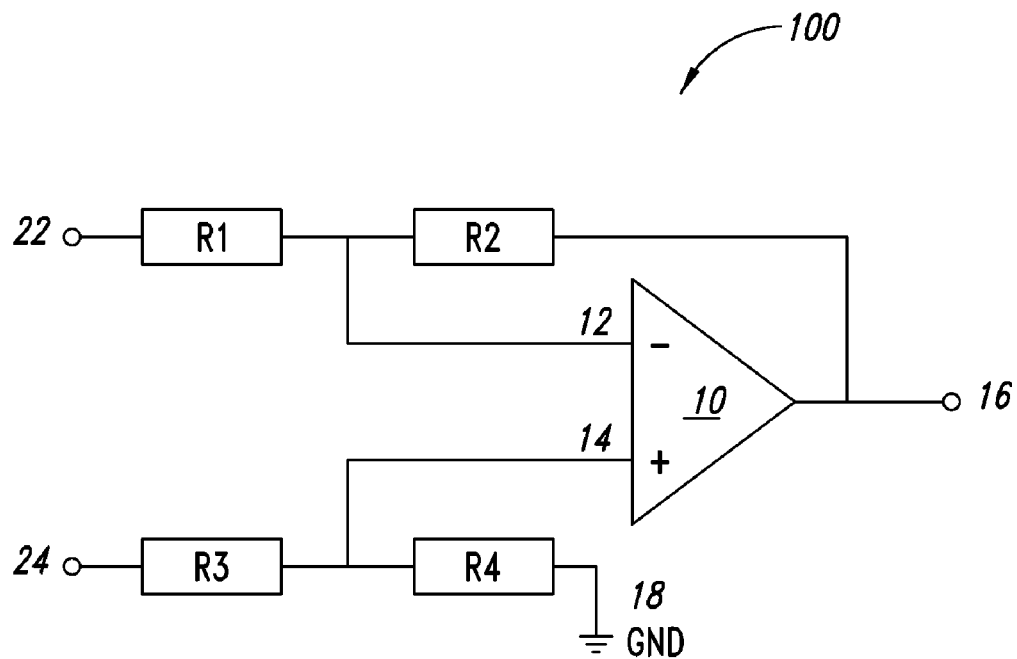
FIG. 2 is a circuit diagram of a differential amplifier.

Referring to FIG. 2, there is illustrated an audio amplifier 100 capable of driving a load, such as an earphone, in a differential amplifier configuration having inverting and non-inverting inputs, 22 and 24. It includes an operational amplifier 10 having an inverting input 12 and a non-inverting input 14, and an output 16. There is a resistance R1 coupled between a first input 22 of the audio amplifier 100 and the inverting input 12, and a resistance R2 coupled between the inverting input 12 and the output 16. There is a resistance R3 coupled between a second input 24 of the audio amplifier 100 and the non-inverting input 14, and a resistance R4 coupled between the non-inverting input 14 and a ground point GND indicated by reference numeral 18. Instead of being coupled to ground, the resistance R4 may alternatively be coupled to a voltage source or another point in the amplifier 100 circuit.

Figure 3:
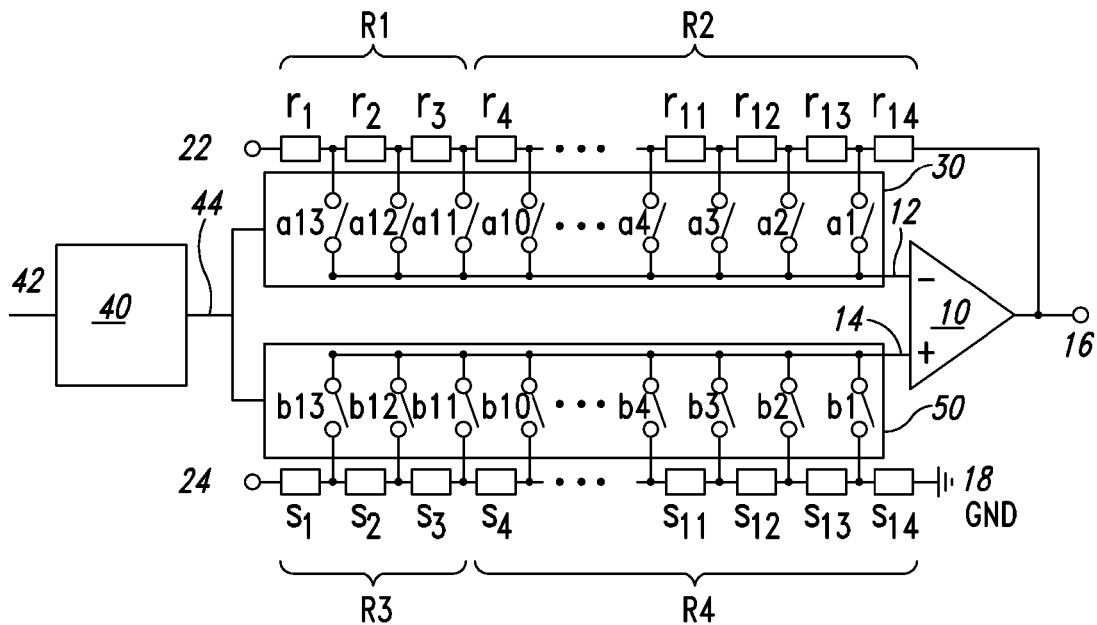
FIG. 3 is a circuit diagram showing more detail of the differential amplifier of FIG. 2.

FIG. 3 illustrates in more detail the audio amplifier 100 of FIG. 2, in particular illustrating how the components R1, R2, R3 and R4 are formed. The combination R1, R2 is formed as a chain of series coupled resistors $r_1 \ldots r_{14}$. There is a switch bank 30 comprising switches a1 . . . a13 for coupling a selectable one of the nodes between any two successive resistors in the chain of resistors $r_1 \ldots r_{14}$ to the inverting input 12. The combination R3, R4 is formed as a chain of series coupled resistors $s_1 \ldots s_{14}$. Correspondingly numbered resistors $r_1 \ldots r_{14}$ and $s_1 \ldots s_{14}$ have nominally equal resistance values, although this is not essential to the disclosure. There is a switch bank 50 comprising switches b1 . . . b13 for coupling a selectable one of the nodes between any two adjacent resistors in the chain of resistors $s_1 \ldots s_{14}$ to the non-inverting input 14. The closure of the switches a1 . . . a13 and b1 . . . b13 is made under the control of a decoder 40, with correspondingly numbered switches a1 . . . a13 and b1 . . . b13 being operated together. In this way, the values of R1 and R2 are selected by partitioning the resistors $r_1 \ldots r_{14}$ by closing a selected one of the switches a1 . . . a13, and the values of R3 and R4 are selected by partitioning the resistors $s_1 \ldots s_{14}$ by closing a selected one of the switches b1 . . . b13. For example, in FIG. 3, switches a11 and b11 are illustrated in the closed position with the other switches all open. In this example R1 includes $r_1, r_2$ and $r_3$, R2 includes $r_4 \ldots r_{14}$, R3 includes $s_1, s_2$, and $s_3$, and R4 includes $s_4 \ldots s_{14}$. The decoder 40 has thirteen output lines 44 for controlling the thirteen switch pairs a1/b1, a2/b2, . . . a13/b13, and four input lines 42 for a binary signal indicating which of the thirteen switch pairs are to be closed.

If the DC gain of the operational amplifier 10 is large enough, the output voltage Vout of the audio amplifier 100 can be written as:

$$Vout = \left(1 + \frac{R2}{R1}\right)\frac{R4}{R3+R4}Vip - \frac{R2}{R1}Vin \quad (1)$$

where Vin is the voltage at the inverting input 22 and Vip is the voltage at the non-inverting input 24. Further, if R2/R1=R4/R3, the gain A of the audio amplifier 100 can be expressed as:

$$A = \frac{Vout}{Vip - Vin} = \frac{R2}{R1} \quad (2)$$

In order to provide N gain settings, the configuration illustrated in FIG. 3 requires 2*(N+1) resistors and 2N switches. In general, for a gain Ai, the resistances R1 and R2 can be expressed as $$R1 \mid_{A=Ai} = \sum_{j=1}^{14-i} r_j \quad (3)$$

$$R2 \mid_{A=Ai} = \sum_{j=14-i+1}^{14} r_j$$

With this configuration, R1 and R3 decrease, and R2 and R4 increase, by the same amount, corresponding to the gain step size. Because gain is determined by the resistance ratio, the gain error depends on the achievable degree of matching of ratio the ratios R2/R1 and R4/R3. Because the resistances of R1 to R4 vary as the gain is switched, the constellation of R1 and R2 changes, even though the resistors $r_1 \ldots r_{14}$ and $s_1 \ldots s_{13}$ all have fixed positions. For the layout of R1, R2, R3 and R4, however, interleaving must be maintained for best matching at each gain setting, as will now be described. Only the layout for R1 and R2 will be described, as the layout for R3 and R4 can follow the same principles.

Figure 4:
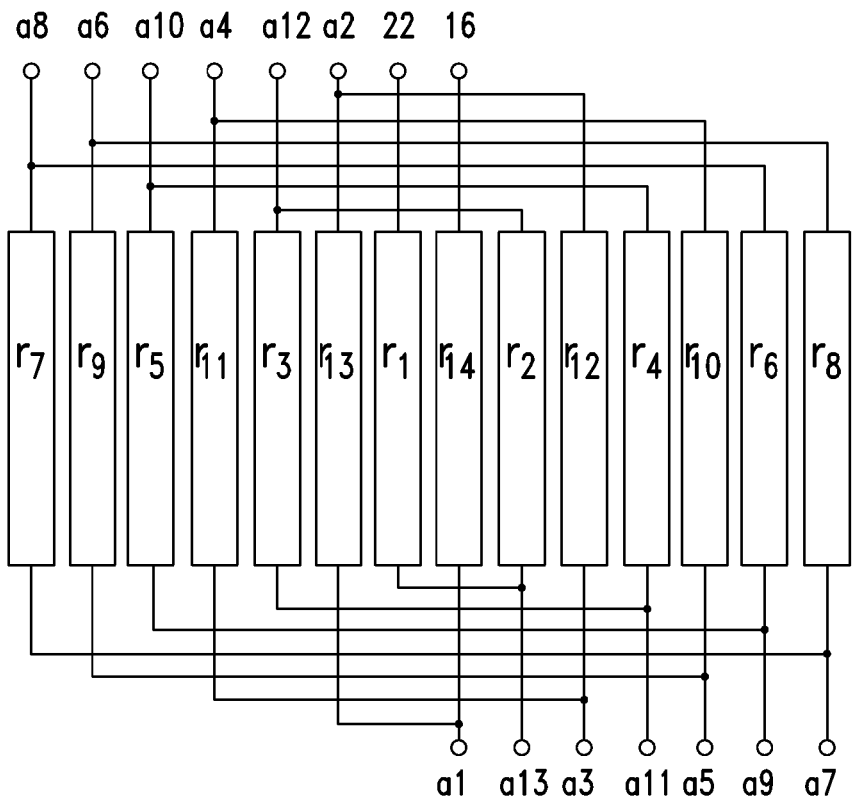
FIG. 4 is a schematic plan layout of resistor elements.

The layout of resistors $r_1 \ldots r_{14}$ and their interconnection is illustrated in FIG. 4. From left to right, the order of placement of the resistors is $r_7, r_9, r_5, r_{11}, r_3, r_{13}, r_1, r_{14}, r_2, r_{12}, r_4, r_{10}, r_6$, and $r_8$. All resistors are connected, as indicated in FIG. 3, in series, thus forming a resistor chain. The switches a1 ... a13 to which each resistor $r_1 \ldots r_{14}$ is coupled are indicated at the top and bottom of each resistor, the taps of the resistor chain being distributed roughly half at top and half at bottom of the arrangement of resistors. With this placement, for every gain setting the resistors forming R1 and R2 are interleaved optimally. This is demonstrated by the table of FIG. 5 where the resistors $r_1 \ldots r_{14}$ are represented by columns, each gain setting is represented by a row A1 ... A13, and for each gain setting the shaded circles indicate the resistors corresponding to R2 and the non-shaded circles indicate the resistors corresponding to R1. It can readily be seen that for each gain setting, a high degree of interleaving has been obtained between the resistors of R1 and the resistors of R2. Resistors R3 and R4 can be implemented in a corresponding fashion.

Figures 5, 6:
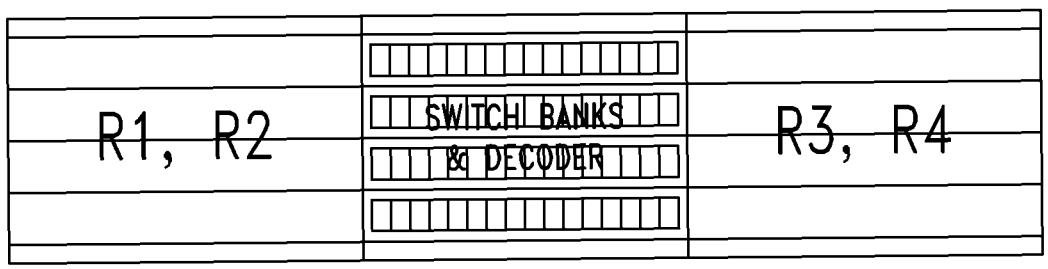
FIG. 5 is a table indicating the resistor elements for different amplifier gain settings.
FIG. 6 is an integrated circuit layout.

FIG. 6 shows a layout of the components R1, R2, R3, R4, the switch bank 30 and the decoder 40 in 65 nm CMOS. In this design each resistor $r_1 \ldots r_{14}$ is implemented with a four-line array of unit resistors of polysilicon type, and about half dummy resistors have been added to occupy otherwise vacant space in the layout and to ensure the end resistors $r_7$ and $r_8$ have neighbors on both sides for best matching. The switch bank 30 and the decoder 40 have been placed between the resistor arrays to provide an equal distance to the resistor arrays.

A single input amplifier, having a non-balanced input, may be formed simply by grounding the non-inverting input 14 of the amplifier illustrated in FIG. 2, thereby avoiding the requirement for the combination R3, R4.

Figure 7A:
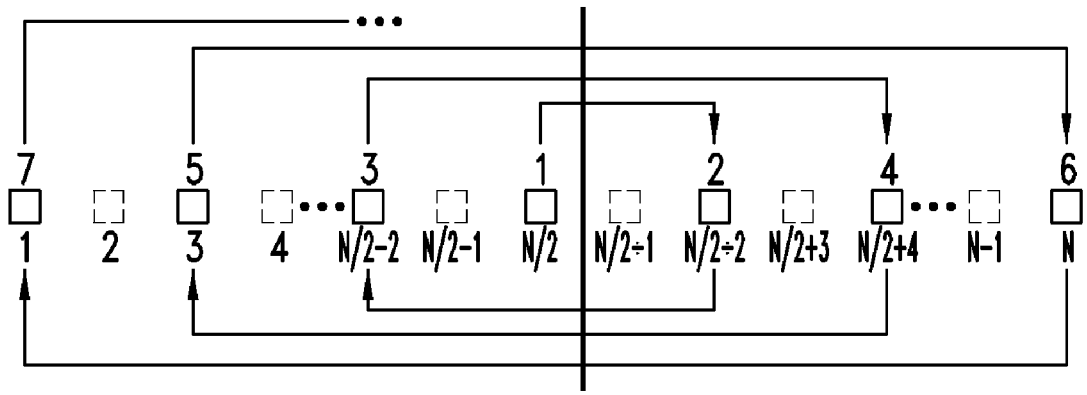
FIG. 7 is a generalized schematic plan layout of resistor elements.
Figure 7B:
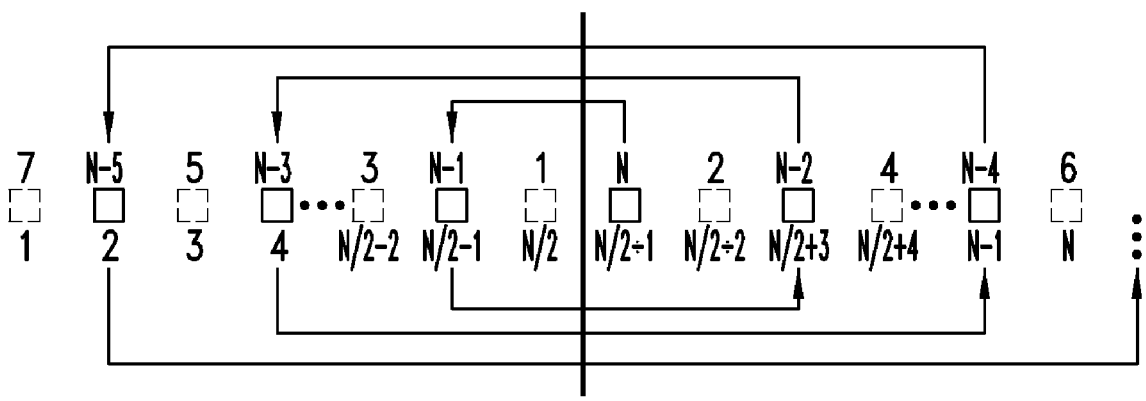

The interleaving arrangement can be extended to any number of gain settings and generalized. A generalized embodiment will be described with reference to FIG. 7 in which the boxes each represent a resistive element, the numbers above the boxes represent the order of the element in the series forming the chain, and the numbers below the boxes represent the positions of the elements in the layout. The arrangement will be described in two stages, considering first the positions of the elements indicated by solid lines in diagram a) of FIG. 7, and secondly the positions of the elements indicated by solid lines diagram b) in FIG. 7.

Let N be the total number of resistor elements connected in series, in order from $r_1$ to $r_N$. If N is even, we first divide the elements into two subsets. The first N/2 elements form one subset and the rest form the other. All N elements will be placed in a row of size N. The positions for the elements are numbered from 1 to N, from left to right. Starting with the first subset of elements which are indicated by the solid lines in diagram a), first we position element $r_1$ at position N/2, then the elements $r_2$ and $r_3$ at positions respectively second right and second left, to element 1, i.e., at positions N/2+2 and N/2−2, respectively. Then elements $r_4, r_5, r_6, \ldots r_{N/2}$ are positioned one after another at every alternate position on alternating sides of element $r_1$ in the same fashion. The arrow lines above and below the elements in diagram a) of FIG. 7 indicate the coupling between successive elements in the chain, and are illustrated progressing in a clock wise direction. Next, we deal with the second subset of elements which are indicated by the solid lines in diagram b), and first place element $r_N$ at position N/2+1, then element $r_{N-1}, r_{N-2}, \ldots r_{N/2+1}$, at every alternate position to the last element placed. This time the coupling between successive elements in the chain progresses anti-clockwise. If N/2 is odd, the most left element will be $r_{N/2}$, and if N/2 is even, element $r_{N/2}$ will be at the far right.

If N is odd, we can first disregard element $r_{(N+1)/2}$ and position the even number of elements N−1 as described above, and finally, place element (N+1)/2 at either the leftmost or right-most position.

Although the placement of the first subset of elements has been described with successive elements in the chain progressing alternately right then left of the initial element in the chain, the order may instead be alternately left and right of the initial element. In this case the elements of the second subset will progress alternately right and left, because the first element of the second subset is always on the opposite side to the last element of the first subset.

Although the placement of the elements has been described with the coupling between the elements progressing clockwise for the first subset of elements and then anti-clockwise for the second subset of elements, the direction of the coupling, and the position of the coupling with respect to the elements, is immaterial to the disclosure, provided that the elements are coupled in a series arrangement.

Either end of the chain may be considered to be the first port, with the other end being the second port.

The position of the elements may be expressed mathematically in the following generalized forms, for N elements $r_1 \ldots r_N$ series coupled in numerical order, where adjacent positions are numbered consecutively. Element $r_i$ has position $$\left\lfloor \frac{N+1}{2} \right\rfloor + (-1)^i \cdot 2 \cdot \left\lfloor \frac{i}{2} \right\rfloor$$

$$\text{for } i = 1 \text{ to } \left\lfloor \frac{N}{2} \right\rfloor$$

and position $$\left\lfloor \frac{N+1}{2} \right\rfloor + (-1)^i \cdot \left(2 \cdot \left\lfloor \frac{N-i}{2} \right\rfloor + 1\right)$$

$$\text{for } i = \left\lfloor \frac{N}{2} \right\rfloor + 1 \text{ to } N.$$

Note that in these expressions the symbol $\lfloor x \rfloor$ indicates the largest integer not exceeding the value x, and is commonly referred to as the floor function. So, for example, $$\left\lfloor \frac{4}{2} \right\rfloor = 2$$

and $$\left\lfloor \frac{5}{2} \right\rfloor = 2.$$

Applying the above formulae, the following are examples of the order in which the elements are positioned.

Three elements: $r_3, r_1, r_2$.
Four elements: $r_3, r_1, r_4, r_2$.
Five elements: $r_3, r_5, r_1, r_4, r_2$.
Six elements: $r_3, r_5, r_1, r_6, r_2, r_4$.
Seven elements: $r_5, r_3, r_7, r_1, r_6, r_2, r_4$.
Ten elements: $r_5, r_7, r_3, r_9, r_1, r_{10}, r_2, r_8, r_4, r_6$.
Eleven elements: $r_7, r_5, r_9, r_3, r_{11}, r_1, r_{10}, r_2, r_8, r_4, r_6$.

Although the layout of resistor elements has been described, the disclosure is equally applicable to the layout of capacitors, inductors or semiconductor components such as transistors, which may therefore be coupled in a corresponding series arrangement and laid out in a corresponding interleaved arrangement.

Although each element has been described as a single entity, each element may comprise a series or parallel arrangement of sub-elements having the same or different resistance, capacitance or inductance, thereby enabling components having any desired value to be formed from sub-elements. In this case, some dummy sub-elements may be included in the layout that do not contribute to the in-circuit resistance, capacitance or inductance, but merely serve to enable a symmetrical layout for best matching and to occupy vacant area.

From reading the present disclosure, other variations and modifications will be apparent to the skilled person. Such variations and modifications may involve equivalent and other features which are already known in the art of integrated circuit layout, and which may be used instead of, or in addition to, features already described herein.

Although the appended claims are directed to particular combinations of features, it should be understood that the scope of the disclosure of the present disclosure also includes any novel feature or any novel combination of features disclosed herein either explicitly or implicitly or any generalization thereof, whether or not it relates to the same disclosure as presently claimed in any claim and whether or not it mitigates any or all of the same technical problems as does the present disclosure.

Features that are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A switchable integrated electronic device, comprising:
   at least three elements series coupled in a chain between a first port and a second port with nodes between successive elements of the chain; and
   a switch circuit for coupling a selectable one of the nodes to a third port;
   wherein, with successive elements in the chain denoted $r_i$, i=1 to N, and with adjacent positions occupied by the elements numbered consecutively 1 to N, then element $r_i$ occupies position $$\left\lfloor \frac{N+1}{2} \right\rfloor + (-1)^i \cdot 2 \cdot \left\lfloor \frac{i}{2} \right\rfloor$$

$$\text{for } i = 1 \text{ to } \left\lfloor \frac{N}{2} \right\rfloor$$

and position $$\left\lfloor \frac{N+1}{2} \right\rfloor + (-1)^i \cdot \left(2 \cdot \left\lfloor \frac{N-i}{2} \right\rfloor + 1\right)$$

$$\text{for } i = \left\lfloor \frac{N}{2} \right\rfloor + 1 \text{ to } N.$$

2. The switchable integrated electronic device as claimed in claim 1, wherein each of the at least three elements comprises a resistive element.

3. The switchable integrated electronic device as claimed in claim 1, wherein each of the at least three elements comprises a capacitive element.

4. The switchable integrated electronic device as claimed in claim 1, wherein each of the at least three elements comprises an inductive element.

5. The switchable integrated electronic device as claimed in claim 1, wherein each of the at least three elements comprises a semiconductor element.

6. An electronic circuit, comprising:
at least one switchable integrated electronic device, the at least one switchable integrated electronic device comprising a first switchable integrated electronic device having a first port coupled to a first circuit input and a second port coupled to a circuit output, and an amplifier having a first amplifier input coupled to a third port of the first switchable integrated electronic device and an amplifier output coupled to the circuit output, each at least one switchable integrated circuit comprising:
at least three elements series coupled in a chain between a first port and a second port with nodes between successive elements of the chain; and
a switch circuit for coupling a selectable one of the nodes to a third port;
wherein, with successive elements in the chain denoted $r_i$, i=1 to N, and with adjacent positions occupied by the elements numbered consecutively 1 to N, then element $r_i$ occupies position $$\left\lfloor \frac{N+1}{2} \right\rfloor + (-1)^i \cdot 2 \cdot \left\lfloor \frac{i}{2} \right\rfloor$$

$$\text{for } i = 1 \text{ to } \left\lfloor \frac{N}{2} \right\rfloor$$

and position $$\left\lfloor \frac{N+1}{2} \right\rfloor + (-1)^i \cdot \left( 2 \cdot \left\lfloor \frac{N-i}{2} \right\rfloor + 1 \right)$$

$$\text{for } i = \left\lfloor \frac{N}{2} \right\rfloor + 1 \text{ to } N.$$

7. The electronic circuit as claimed in claim 6, comprising a second switchable integrated electronic device having its first port coupled to a second circuit input, its second port coupled to ground or another point in the circuit, and its third port coupled to a second input of the amplifier, wherein the first and second amplifier inputs are respectively inverting and non-inverting.

8. The electronic circuit as claimed in claim 7, wherein the respective at least three elements of the first and second switchable integrated electronic devices are equal in number and wherein the respective switch circuit of the first and second switchable integrated electronic devices is adapted to couple a corresponding selectable one of the nodes of the first and second switchable integrated electronic devices to the respective third port.

9. A circuit, comprising:
series coupled first and second electronic element circuits, each of the first and second electronic element circuits comprising a chain of series-coupled elements;
first and second switch banks coupled respectively to the first and second electronic circuits, each switch bank comprising a plurality of switches for coupling a selectable node between any two successive elements in the chain of series-coupled elements in the respective electronic element circuit to a conductor;
a control circuit to control each of the plurality of switches;
wherein each of the plurality of elements occupy a position in the chain of series-coupled elements for best matching of performance, in which N is the total number of elements connected in series in the chain in order from $r_1$ to $r_N$ with r denoting a respective individual element, and when N is even, element $r_1$ is positioned at N/2 in the chain, element $r_2$ and $r_3$ at positions respectively second right and second left to element $r_1$, which are positions N/2+2 and N/2-2, respectively, with elements $r_4$, $r_5$, $r_6$, ... $r_{N/2}$ positioned one after another at every alternate position on alternating sides of element $r_1$ in the same fashion that applies to the first N/2 elements, which form a first subset, and a second subset of elements in the N chain of elements having a first place element $r_N$ at position N/2+1, and elements $r_{N-1}$, $r_{N-2}$, ... $r_{(N-2)+1}$, at every alternate position to the last element placed, and in which coupling between successive elements in the first subset progresses in a clockwise direction starting at $r_1$ and going to $r_2$, $r_3$, ... to $r_{N/2}$ sequentially and coupling in the second subset of elements progressing counterclockwise starting with element $r_N$ and going to element $r_{N-1}$, then element $r_{N-2}$ and concluding with the final element in the subset; and
when N is odd, the element $r_{(N+1)/2}$ is disregarded and the elements are positioned with the even number of elements N−1 as described above and element (N+1)/2 is placed at either a left-most or right-most position in the chain.

10. The circuit of claim 9, wherein the elements in the chain of elements each comprise the same type of element taken from among resistive elements, capacitive elements, inductive elements, and semiconductor elements.

11. The circuit of claim 10, comprising an audio amplifier having a first input coupled to the conductor that is connected to the plurality of switches for selective coupling to the nodes between the elements in the chain of elements.

12. A circuit, comprising:
a chain of N series-coupled electronic elements having a node between successive elements in the chain, the order of elements in the chain of N elements, with i=1, arranged with adjacent positions occupied by the elements numbered consecutively from 1 to N, with element $r_i$ occupying position $$\left\lfloor \frac{N+1}{2} \right\rfloor + (-1)^i \cdot 2 \cdot \left\lfloor \frac{i}{2} \right\rfloor$$

$$\text{for } i = 1 \text{ to } \left\lfloor \frac{N}{2} \right\rfloor$$

and position $$\left\lfloor \frac{N+1}{2} \right\rfloor + (-1)^i \cdot \left( 2 \cdot \left\lfloor \frac{N-i}{2} \right\rfloor + 1 \right)$$

$$\text{for } i = \left\lfloor \frac{N}{2} \right\rfloor + 1 \text{ to } N.$$

13. The circuit of claim 12, comprising a plurality of switches, each switch having a first terminal coupled to a respective node of the chain of elements and a second terminal coupled to a common conductive line, each of the plurality of switches having a control terminal coupled to a control circuit that selectively couples the nodes to the common conductive line.

14. The circuit of claim 13, wherein each of the elements comprises a single type of electronic element taken from a group comprising resistive elements, capacitive elements, inductive elements, and semiconductor elements.

15. The circuit of claim 14, comprising an amplifier having first and second inputs, and further comprising a second chain of electronic elements, with the first chain of elements selectively coupled to the first input of the amplifier by the switches via the common conductive line and the second chain of elements selectively coupled to the second input of the amplifier by the switches via a further conductive line.

16. A method of manufacturing a switchable integrated electronic device, comprising:
   forming at least three electronic elements series coupled in a chain between a first port and a second port and providing a node between successive elements of the chain;
   forming a switch circuit for coupling a selectable one of the nodes to a third port;
   wherein, with successive elements in the chain are denoted $r_i$, i=1 to N, and with adjacent positions occupied by the elements numbered consecutively 1 to N, then element $r_i$ occupies position $$\left\lfloor \frac{N+1}{2} \right\rfloor + (-1)^i \cdot 2 \cdot \left\lfloor \frac{i}{2} \right\rfloor$$
$$\text{for } i = 1 \text{ to } \left\lfloor \frac{N}{2} \right\rfloor$$

and position $$\left\lfloor \frac{N+1}{2} \right\rfloor + (-1)^i \cdot \left(2 \cdot \left\lfloor \frac{N-i}{2} \right\rfloor + 1\right)$$
$$\text{for } i = \left\lfloor \frac{N}{2} \right\rfloor + 1 \text{ to } N.$$

17. The method as claimed in claim 16, wherein forming the at least three electronic elements comprises forming at least three resistive elements.

18. The method as claimed in claim 16, wherein forming the at least three elements comprises forming at least three capacitive elements.

19. The method as claimed in claim 16, wherein forming the at least three elements comprises forming at least three inductive elements.

20. The method as claimed in claim 16, wherein forming the at least three elements comprises forming at least three semiconductor elements.

* * * * *